(12) United States Patent
Lu et al.

(10) Patent No.: US 6,421,289 B1
(45) Date of Patent: Jul. 16, 2002

(54) METHOD AND APPARATUS FOR CHARGE-TRANSFER PRE-SENSING

(75) Inventors: Shih-Lien Lu, Portland; Dinesh Somasekhar, Hillsboro, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/539,933

(22) Filed: Mar. 31, 2000

(51) Int. Cl.$^7$ ................................................ G11C 7/00
(52) U.S. Cl. ......................... 365/205; 365/63; 365/207
(58) Field of Search ........................... 365/205, 63, 68, 365/207, 197

(56) References Cited

U.S. PATENT DOCUMENTS 5,226,005 A * 7/1993 Lee et al. ...................... 365/49
5,796,671 A * 8/1998 Wahlstrom .................. 365/203

* cited by examiner

Primary Examiner—Michael S. Lebentritt
Assistant Examiner—Van Thu Nguyen
(74) Attorney, Agent, or Firm—Blakley, Sokoloff, Taylor & Zafman LLP

(57) ABSTRACT

In one embodiment, a method comprises splitting a first data line into two or more first data line segments, wherein each of the first data line segments is connected to one transfer gate of a plurality of first data line transfer gates and to a first group of one or more sense amplifiers of a plurality of sense amplifiers; splitting a second data line into two or more second data line segments, wherein each of the second data line segments is connected to one transfer gate of a plurality of second data line transfer gates and to a second group of one or more sense amplifiers of the plurality of sense amplifiers; and providing voltage differences between each of the sense amplifiers of the first and second groups, wherein at least one of the voltage differences is an incorrect voltage difference that is corrected by the other voltage differences.

22 Claims, 5 Drawing Sheets

METHOD AND APPARATUS FOR CHARGE-TRANSFER PRE-SENSING

FIELD OF THE INVENTION

The present invention relates to the field of integrated circuit design. In particular, the present invention relates to charge-transfer pre sensing in memory devices.

BACKGROUND OF THE INVENTION

As memory devices get smaller, the silicon oxide thickness of devices is reduced. The oxide thickness is directly related to the breakdown voltage of the device. The breakdown voltage is the maximum voltage that may be applied to the device before it breaks down. However, as memory devices get smaller, the threshold voltage and trip voltages are not scaled in similar proportion to the breakdown voltage. The threshold voltage is the minimum voltage required to turn-on the memory device. The trip voltage is the voltage at which an inverter "flips." A properly balanced inverter will trip at half its supply voltage level.

The number of transistors integrated on integrated circuits continue to increase as the size of devices are scaled down. As device sizes are decreased, the supply voltage as well as threshold voltage needs to be scaled to provide higher performance. The impact of inter-transistor variations on integrated circuits in terms of performance becomes more significant. One variation is the threshold voltage variation.

There exists a fundamental variability in the threshold voltage Vt due to the finite number of dopant atoms in the extremely small MOSFET channel area. This is true even in the absence of systematic variations, such as, implant nonuniformities, and Leff and Weff variations. Threshold variations will impact the design of high performance CMOS circuits. It causes the integrated logic circuit to be unstable or return uncertain results. A larger voltage margin must be used to warrant correct device operation without sacrificing performance.

In a dynamic RAM circuit, voltage differences are created during the read phase of the operation from charge sharing. Charge transfer is a scheme used to amplify the voltage difference created by reading the storage device using a single transistor. FIG. 1 is a block diagram of a prior art charge-transfer pre-sensing scheme with Vcc/2 bit line pre-charging. Bit line (BIT) 101 is connected with bit line capacitor 111 and transfer gate ($MTG_1$) 120. Sense amplifier capacitor 131 is connected to transfer gate 120 and sense amplifier 140. Bit bar line (BIT) 151 is connected with bit bar line capacitor 161 and transfer gate ($MTG_2$) 170. Sense amplifier capacitor 181 is connected to transfer gate 170 and sense amplifier 140. Sense amplifier 140 is a cross-coupled amplifier including first inverter 141 and second inverter 142 connected between sense amplifier capacitor 131 and sense amplifier capacitor 181.

First inverter 141, second inverter 142, transfer gate ($MTG_1$) 120, and transfer gate ($MTG_2$) 170 suffer from variations in their associated threshold voltages. For example, even though they are all transfer gates, the threshold voltages of $MTG_1$ 120 and $MTG_2$ 170 are not necessarily the same, nor are the threshold voltages of inverters 141 and 142 necessarily the same.

A DC power supply voltage (Vcc) is applied to the memory device 100. Initially both Bit and Bit bar line voltages $V_B$ 110 and $V_B$ 160 are pre-charged to Vcc/2, therefore, pre-charging $C_{BIT}$ 111 and 161. Then the transfer gate 149 is turned off and, either $V_B$ 110 or $V_B$ 160 is brought to a new voltage either lower or higher than Vcc/2 depending on what content is stored. At the same time, Bit line 110 sense amplifier voltage ($V_{SA}$) 130 and Bit bar line 160 sense amplifier voltage (VSA) 180 are pre-charged to Vcc; therefore, pre-charging sense amplifier capacitors (CSA) 131, 181.

CSA 131, 138 are chosen to have a capacitance of a fraction of $C_{BIT}$ 111, 161. Thus, when the transfer gate 149 is turned on, charge transfers from CSA 131, 181 to $C_{BIT}$ 111, 161 and a large voltage change develops at VSA 130 and VSA 180. The large voltage change is sensed by sense amplifier 140.

Design problems occur when the device fails to turn on, because voltages can not be applied that are high enough to overcome the required threshold voltage without exceeding the breakdown voltage of the device. This makes the reliable sensing of voltage differences developed between Bit line 101 and Bit bar line 151, increasingly difficult.

SUMMARY OF THE INVENTION

The present invention provides a method and apparatus for charge-transfer pre-sensing in memory devices. The apparatus splits a first data line into two or more segments. Each segment is connected to one or more transfer gate and sense amplifier. A second data line is split into two or more segments. Each segment is connected to one or more transfer gate and sense amplifier. A voltage differential is provided between each of the sense amplifiers. At least one of the voltage differences is an incorrect voltage difference that is corrected by the other voltage differences.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

DETAILED DESCRIPTION OF THE PREFERRED EMBODIMENT

A method and apparatus for charge-transfer pre-sensing in memory devices is described. The apparatus splits a first data line into two or more segments. Each segment is connected to one or more transfer gate and sense amplifier. A second data line is split into two or more segments. Each segment is connected to one or more transfer gate and sense amplifier. A voltage differential is provided between each of the sense amplifiers. At least one of the voltage differences is an incorrect voltage difference that is corrected by the other voltage differences.

In the following description, for purposes of explanation, specific nomenclature is set forth to provide a thorough understanding of the present invention. However, it will be apparent to one skilled in the art that these specific details are not required in order to practice the present invention. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
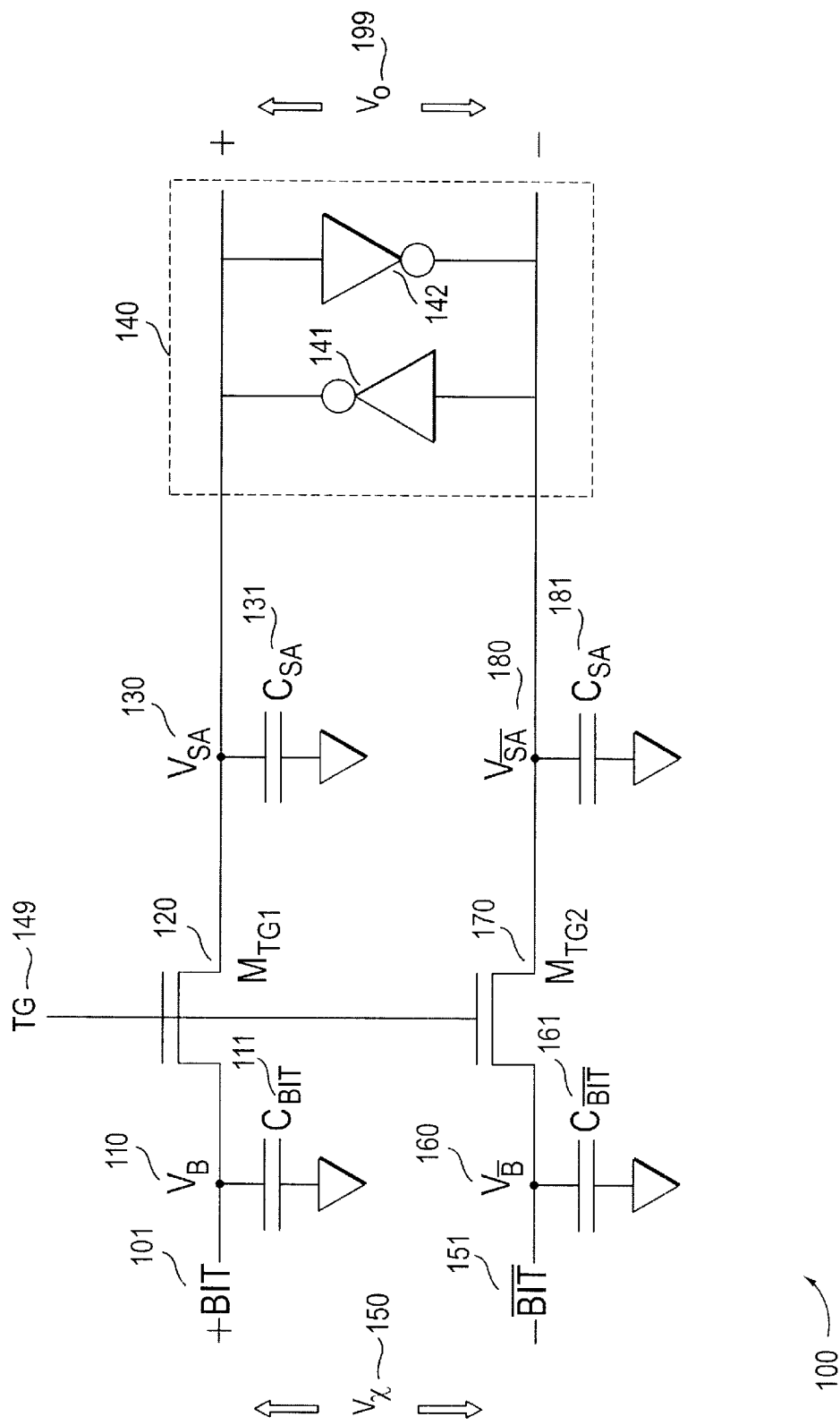
FIG. 1 is a block diagram of a prior art charge transfer pre-sensing scheme with Vcc/2 bit line pre-charging.
Figure 2:
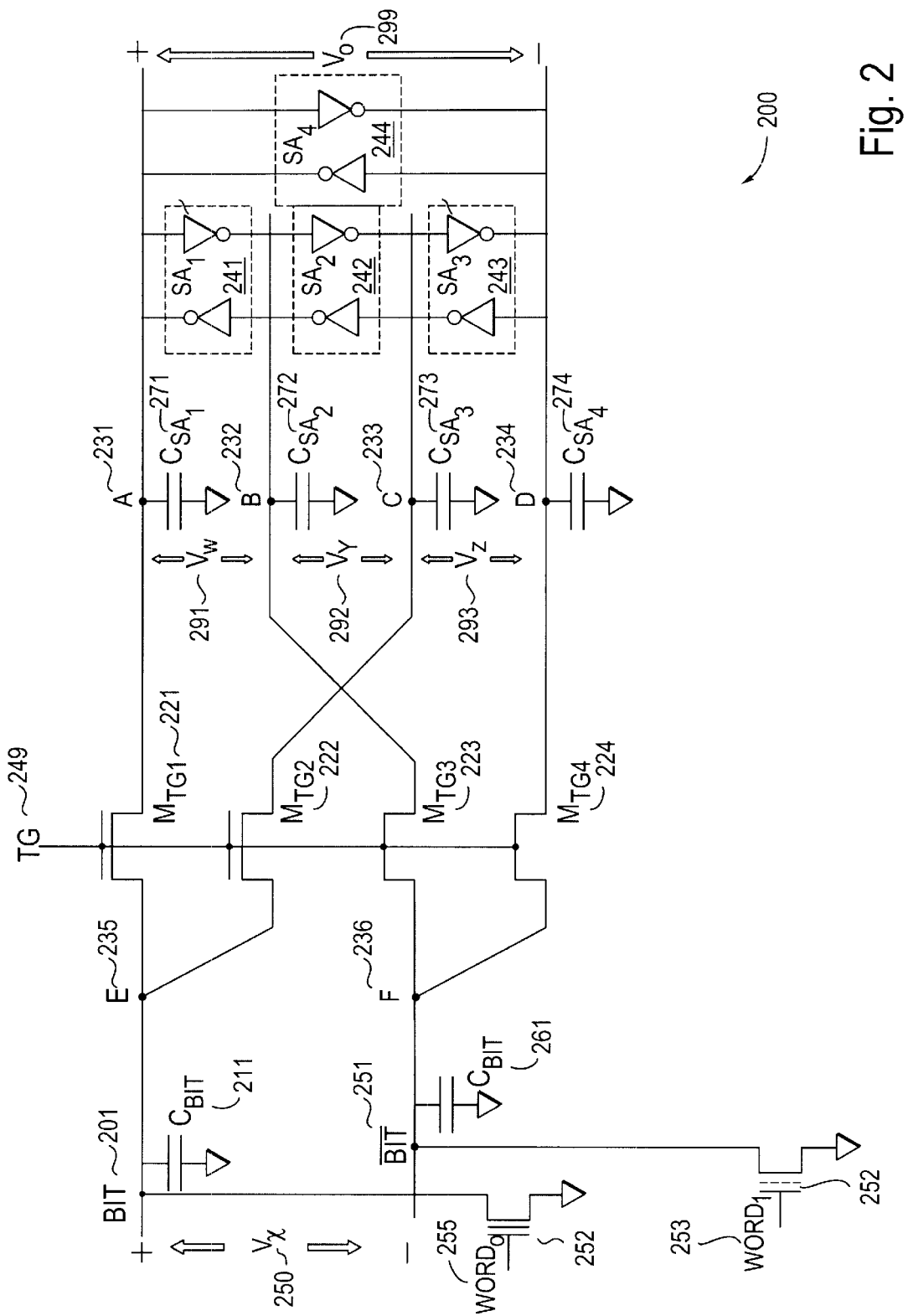
FIG. 2 is a block diagram of one embodiment of charge transfer pre-sensing with quad amplifiers.

FIG. 2 is a block diagram of one embodiment of charge transfer pre-sensing with quad amplifiers. Bit line 201 is connected with bit line capacitor ($C_{BIT}$) 211, transfer gate ($MTG_1$) 221 and transfer gate ($MTG_2$) 222 at node E 235. Sense amplifier capacitor ($C_{SA1}$) 271 is connected to sense amplifier ($SA_1$) 241, sense amplifier ($SA_4$) 244, and $MTG_1$ 221 at node A 231. Sense amplifier capacitor ($C_{SA3}$) 273 is connected to sense amplifier ($SA_3$) 243, sense amplifier ($SA_2$) 242, and $MTG_2$ 222 at node C 233.

Bit bar line 251 is connected with $C_{BIT}$ 261, transfer gate ($MTG_3$) 223, and transfer gate ($MTG_4$) 224 at node F 236. Sense amplifier capacitor ($CSA_2$) 272 is connected to $SA_1$ 241, sense amplifier ($SA_2$) 242, and $MTG_3$ 223 at node B 232. Sense amplifier capacitor ($CSA_4$) 274 is connected to $SA_3$ 243, $SA_4$ 244, and $MTG_4$ 224 at node D 234. Capacitors 211, 261, 271, 272, 273, and 274 are grounded.

In one embodiment, sense amplifiers 241, 242, 243, 244 are cross-coupled inverters, although in alternate embodiments they may be operational amplifiers or devices with similar characteristic. In one embodiment, transfer gates 221–224 are Metal Oxide Semiconductor Field Effect Transistors (MOSFETs). In another embodiment the transfer gates 221–224 may be replaced by n-channel or p-channel Bipolar Junction Transistors (BJTs).

Although connected in a cascaded fashion, sense amplifiers may be connected in any fashion providing differential voltage sensing of nodes A–D 231–234. The memory cells 252 of memory device 200 may be with volatile memory cells that may store multiple states of information, such as, Random Access Memory (DRAM) cells. In another embodiment, the memory device 200 may be used as a Static Random Access Memory (SRAM) Level Two (L2) cache replacement. In yet another embodiment, memory device 200 may be implemented in nonvolatile memory cells, such as, Electrically Erasable Programmable Read Only Memories (EEPROMs). Memory device 200 may be used in On-chip High-density Memories (OHMs), thus, integrating logic and memory on the same integrated circuit to reduce memory latency and provide increased memory bandwidth. Furthermore the quad sense amplifiers 241–244 of apparatus 200 compensate for threshold voltage variations inherently caused by the manufacturing of $SA_1$–$SA_4$ 241–244 and $MTG_1$–$MTG_4$ 221–224.

By selecting $C_{SA1}$–$C_{SA4}$ to have smaller capacitances than $C_{BIT}$ 211, 261, differential voltage Vx 250 between bit line 201 and bit bar line 251 is amplified with a gain of approximately $C_{BIT}/C_{SA}$. Differences in threshold voltages (dVt) associated with $MTG_1$–$MTG_4$ 221–224 are also amplified. By increasing the differential voltage provided to $SA_1$–$SA_4$ 241–244, the effect of dVt variations may be overwhelmed. This is accomplished by increasing Vx 250 through the following charge transfer techniques.

Figure 3:
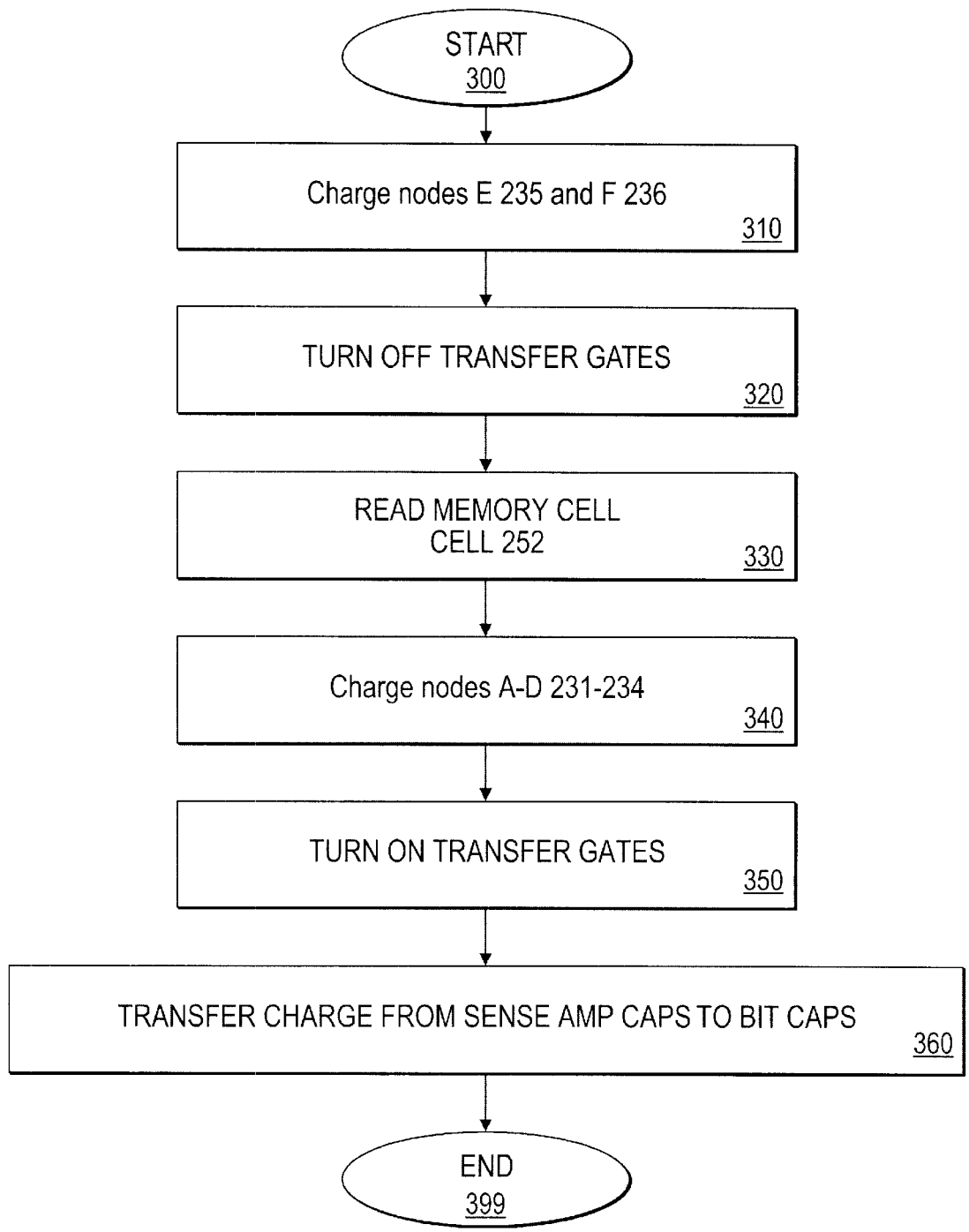
FIG. 3 is a flow diagram of one embodiment of the charge transfer scheme implemented by memory device 200.

FIG. 3 is a flow diagram of one embodiment of the charge-transfer scheme implemented by memory device 200. As described in detail above, in order to better sense voltage changes caused by reading memory cell 252, a larger bit line/bit bar line voltage differential Vx 250 is desirable. A large Vx 250 may be obtained by increasing Vcc, however, increasing the supply Vcc power is undesirable in smaller memory devices with low breakdown voltages. The present scheme provides a larger Vx 250 without increasing the power supply voltage Vcc by using two sense amplifier capacitors ($C_{SA1}$, 271 and $C_{SA3}$ 273) to charge bitline capacitor ($C_{BIT}$) 211 and without affecting the gain of $C_{BIT}/C_{SA}$.

The process starts in block 300. In block 310, node E 235 and node F 236 are charged to Vcc/2. In alternate embodiments, node E 235 and node F 236 may be charged to any voltage level between Vcc/2 and ground. Transfer gates ($MTG_1$–$MTG_4$) 221–224 are turned off in block 320 by bringing node TG 249 to a low level. In block 330, word line 0 255 and word line 1 253 are activated, memory cells 252 are read. A slight change in Vx 250 appears between bit line 201 and bit bar line 251.

In block 340, nodes A–D 231–234 are charged to Vcc. In alternate embodiments, nodes A–D 231–234 may be charged to any voltage level above Vcc but less than the breakdown voltage of the memory device 200. $MTG_1$–$MTG_4$ 221–224 are turned on in block 350 by charging node TG 249 to a high level. In one embodiment, the high level is equal to Vcc/2 plus the maximum threshold voltage of $MTG_1$ $MTG_4$ 221–224.

In block 360, the charge stored in sense amplifier capacitors ($CSA_1$–$CSA_4$) 271–274 is transferred to $C_{BIT}$ 211, 261. Charge transfer to $C_{BIT}$ 211, 261 completes when the output voltage Vo 299 reaches Vcc/2 approximately. For each of $MTG_1$–$MTG_4$ 221–224, the voltage to which $C_{BIT}$ is charged by $C_{SA}$ is the gate's threshold voltage. In another embodiment, Vo 299 may reach Vcc approximately. The charge transfer generates a small voltage change in Vx 250; however, in this embodiment, a large voltage change occurs in Vo 299. Although shown as the voltage difference across $SA_4$ 244, Vo 299 can be measured across any of the sense amplifiers, $SA_1$–$SA_4$ 241–244. The present techniques compensate for variances in threshold voltages of $MTG_1$–$MTG_4$ that affects when $C_{BIT}$ 211, and 261 are charged. Thus, even if one of $MTG_1$–$MTG_4$ 221–224 fails to turn on, an averaging effect occurs in which the majority of turned "on" gates force the "off" gate to turn on. The process ends in block 399. Although presented as a sequence of events, the flow of FIG. 3 may occur in a parallel or serial fashion and in a different order without departing from the spirit and scope of the invention.

Figure 4:
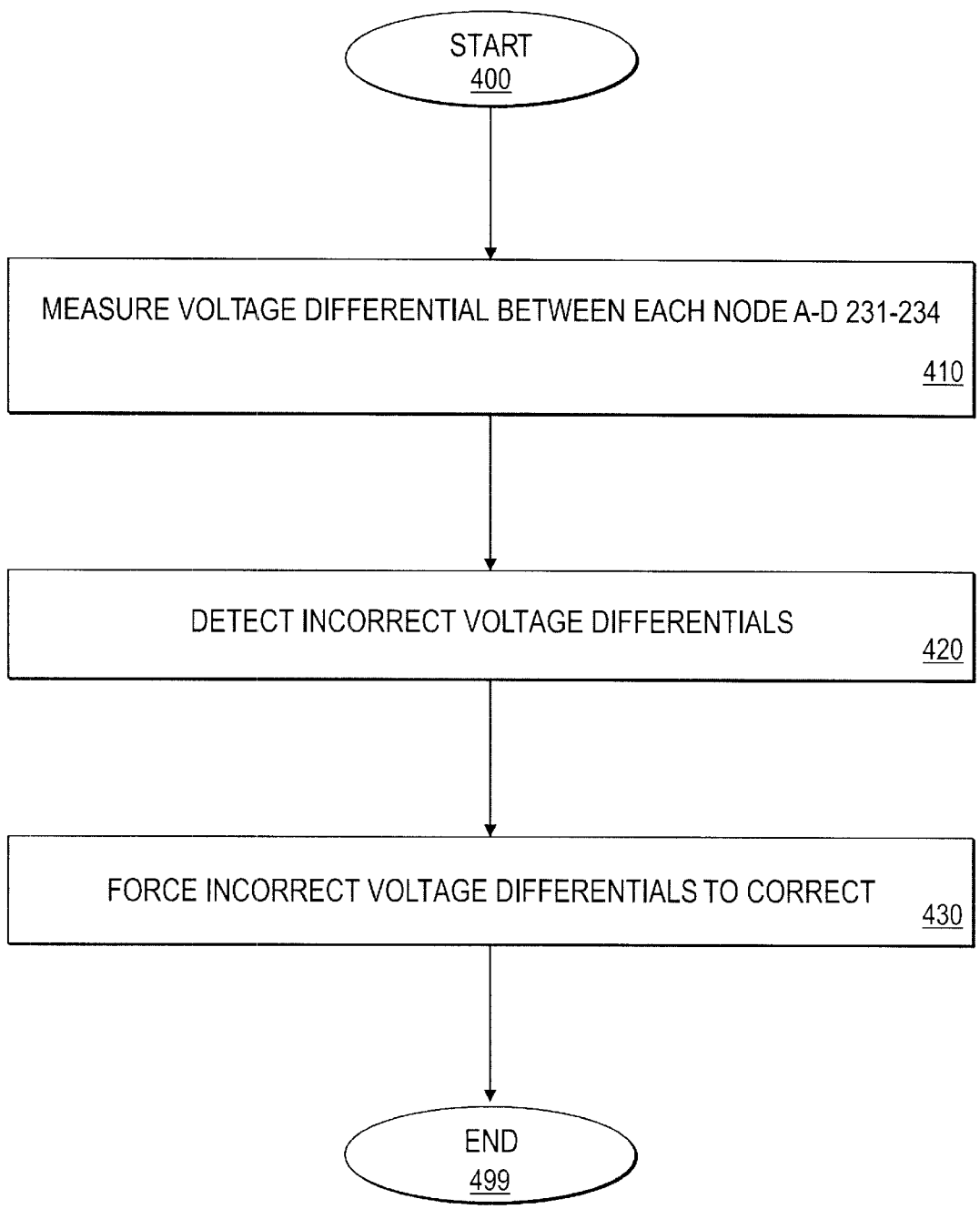
FIG. 4 is a flow diagram of one embodiment of the sense amplification scheme implemented by memory device 200.

FIG. 4 is a flow diagram of one embodiment of the sense amplification scheme implemented by memory device 200. The cross-coupled inverter configuration of sense amplifiers $SA_1$–$SA_4$ 241–244, includes an offset or threshold voltage (Vt), as well as, a trip voltage (Vtrip). To turn-on the inverter, a voltage of Vt must be provided. To make the inverters "flip" a voltage of at least Vtrip must be provided. The sense amplification scheme described is compatible with the charge transfer scheme of FIG. 3. In alternate embodiments, the sense amplification scheme may be implemented with non-charge transfer schemes, as well.

The sense amplification scheme starts in block 400. In block 410 four voltage differentials are measured: Vw 291, Vy 292, Vz 293, and Vo 299. Vw 291 is the voltage differential of $SA_1$ 241 between node A 231 and node B 232. Vy 292 is the voltage differential of $SA_2$ between node B 232 and node C 233. Vz 293 is the voltage differential of $SA_3$ 243 between node C 233 and node D 234. Finally, Vo 299 is the voltage differential of $SA_4$ 244 between node A 231 and node D 243.

Figure 5:
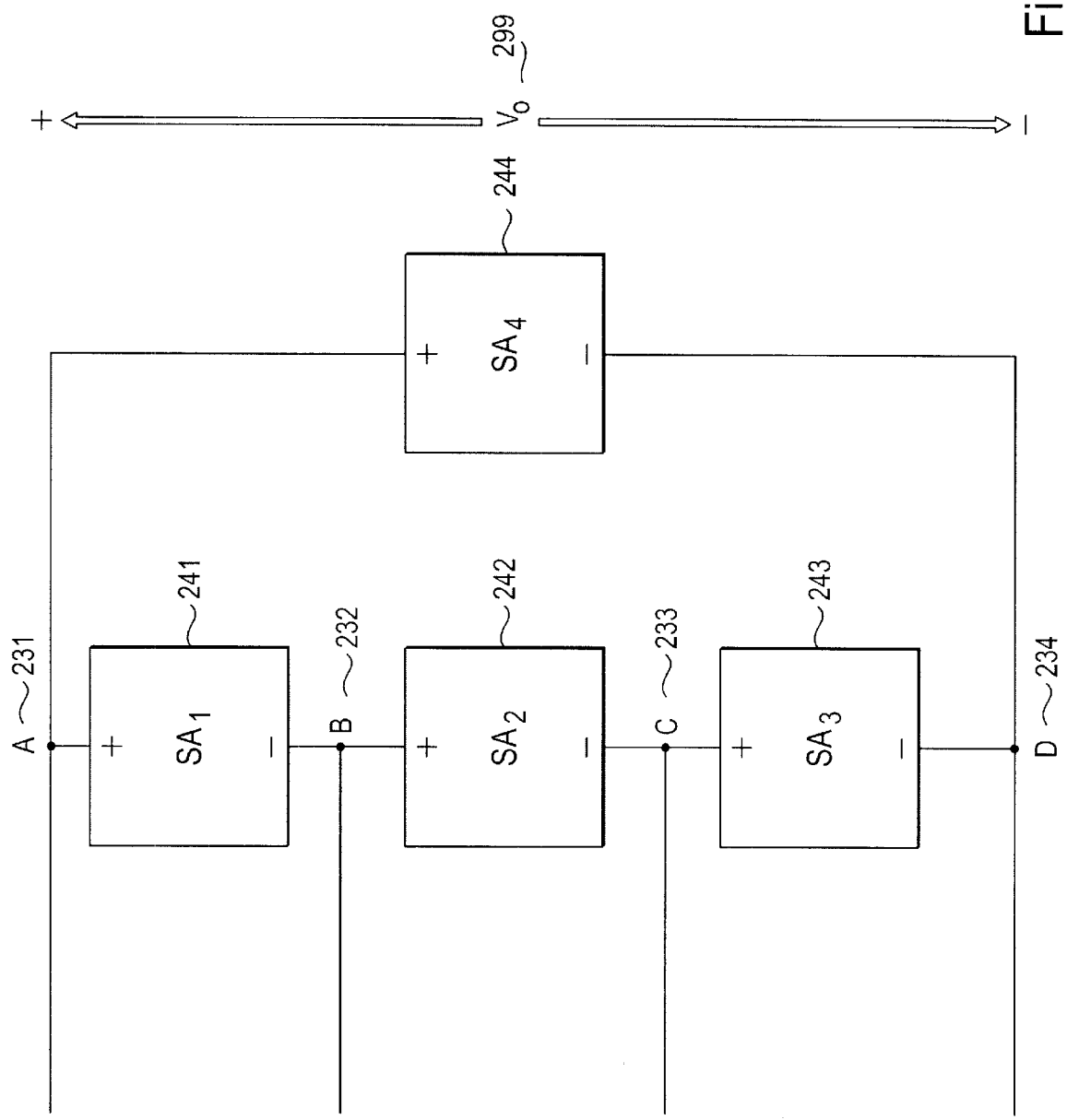
FIG. 5 is a block diagram of a sense amplifier circuit with an incorrect voltage differential.

In block 420, device 200 detects incorrect voltage differentials. An incorrect voltage differential occurs when a cross-coupled inverter fails to flip in the right direction. For example, FIG. 5 is a block diagram of a sense amplifier circuit with an incorrect voltage differential. With reference to node A 231, $SA_4$ 244 has a positive voltage differential. Thus, the voltages across $SA_1$–$SA_3$ 241–243 should also have a positive voltage differential. With reference to node A 231, $SA_1$ 241 has a correct positive voltage differential. Thus, both $SA_1$ 241 and $SA_4$ 244 have positive potentials at node A 231. With reference to node C 233, $SA_3$ also has a correct positive voltage differential. Thus both $SA_3$ 243 and $SA_4$ 244 have negative potentials at node D 234. With reference to node B 232 and node C 233, $SA_2$ has an incorrect voltage differential. Inverters in $SA_2$ 242 flips in the wrong direction. Thus, $SA_2$ has a negative potential with reference to node C 233 when it should have a positive potential. $SA_2$ also has a positive potential with reference to node B 232 when it should have a negative potential. Inverters fail to flip in the correct direction when the voltage differential Vw 291, Vy 292, Vz 293, or Vo 299 is less than the trip voltage Vtrip due to threshold voltage mismatches as described above.

In block 430, the incorrect voltage differential is forced to correct automatically. Sense amplifiers having the correct voltage differentials overwhelm the incorrect sense amplifier, such that the incorrect sense amplifier flips in the correct direction. The scheme ends in block 499. The sense amplification scheme described institutes a voting system, where the majority of correct sense amplifiers force the incorrect sense amplifier to flip in the correct direction.

Although described with four sense amplifiers, the present apparatus and method may be implemented with more than four sense amplifiers as well. The functional blocks of FIGS. 1–5 may be rearranged, and the break down of functions as presented may be altered within the spirit and scope of the invention. Memory device 200 may be implemented on silicon substrates, as well as, equivalent semiconductors. For example, galium arsenide (GaAs), and silicon-on-insulator technologies may be used in alternate embodiments. The processes embodied and executed by memory device 200 typically occur in a parallel or simultaneous fashion, as well as, the linear or serial fashion typical of flow diagrams. In some illustrations, details that would be obvious to one skilled in the art are left out so as to not obscure the present details of the invention.

In the foregoing detailed description, the method and apparatus of the present invention has been described with reference to specific exemplary embodiments thereof. It will, however, be evident that various modifications and changes may be made thereto without departing from the broader spirit and scope of the present invention. In particular, the separate blocks of the various block diagrams represent functional blocks of methods or apparatuses and are not necessarily indicative of physical or logical separations or of an order of operation inherent in the spirit and scope of the present invention. For example, the various blocks of FIG. 2 may be integrated into components, or may be subdivided into components. Moreover, the blocks of FIG. 4 represent portions of a method which, in some embodiments, may be reordered or may be organized in parallel rather than in a linear or step-wise fashion. The present specification and figures are accordingly to be regarded as illustrative rather than restrictive.

We claim:

1. A method, comprising:
   splitting a first data line into two or more first data line segments, wherein each of the first data line segments is connected to one transfer gate of a plurality of first data line transfer gates and to a first group of one or more sense amplifiers of a plurality of sense amplifiers;
   splitting a second data line into two or more second data line segments, wherein each of the second data line segments is connected to one transfer gate of a plurality of second data line transfer gates and to a second group of one or more sense amplifiers of the plurality of sense amplifiers; and
   providing voltage differences between each of the sense amplifiers of the first and second groups, wherein at least one of the voltage differences is an incorrect voltage difference that is corrected by the other voltage differences.

2. The method as claimed in claim 1, further comprising charging a large charge storing device to a programmable level with a plurality of small charge storing devices to overcome threshold variations in the plurality of first data line and second data line transfer gates.

3. The method as claimed in claim 2, further comprising providing each of the voltage differences to an associated sense amplifier of the plurality of sense amplifiers.

4. The method as claimed in claim 3, further comprising detecting an incorrect voltage difference.

5. The method as claimed in claim 4, further comprising forcing the incorrect voltage difference to correct.

6. The method of claim 5, wherein the charge storing devices are capacitors.

7. The method of claim 5, wherein the first data line is a bit line and the second data line is a complementary bit line.

8. The method of claim 5, further comprising, receiving data signals from a memory cell.

9. The method of claim 1, wherein some or all of the first group of sense amplifiers are the same as some or all of the second group of sense amplifiers.

10. An apparatus, comprising:
    a first means for carrying data signals split into two or more segments, wherein each of the first-data line segments is connected to one transfer gate of a plurality of first data line transfer gates and to a first group of one or more sense amplifiers-of a plurality of sense amplifiers;
    a second means for carrying data signals split into two or more segments, wherein each of the second data line segments is connected to one transfer gate of a plurality of second data line transfer gates and to a second group of one or more sense amplifiers of the plurality of sense amplifiers; and
    means for providing voltage differences between each of the sense amplifiers, wherein at least one of the voltage differences is an incorrect voltage difference that is corrected by the other voltage differences.

11. The apparatus as claimed in claim 10, further comprising means for charging a large charge storing device to a programmable level with a plurality of small charge storing devices to overcome threshold variations in the plurality of first data line and second data line transfer gates.

12. The apparatus as claimed in claim 11, further comprising means for providing each of the voltage differences to an associated sense amplifier of the plurality of sense amplifiers.

13. The apparatus as claimed in claim 12, further comprising means for detecting an incorrect voltage differences.

14. The apparatus as claimed in claim 13, further comprising means for forcing the incorrect voltage differential to correct.

15. The apparatus of claim 14, wherein the charge storing devices are capacitors.

16. The apparatus of claim 14, wherein the first data line is a bit line and the second data line is a complementary bit line.

17. The apparatus of claim 14, further comprising, means for receiving data signals from a memory cell.

18. The apparatus of claim 10, wherein some or all of the first group of sense amplifiers are the same as some or all of the second group of sense amplifiers.

19. An apparatus, comprising:
- a first data line connected to a first large charge storing device and two or more transfer gates of a plurality of first data line transfer gates;
- a second data line connected to a second large charge storing device and two or more transfer gates of a plurality of second data line transfer gates;
- a plurality of small charge storing devices, wherein each of the small charge storing devices of the plurality of small charge storing devices is connected to an associated transfer gate of the plurality of first data line and second data line transfer gates; and
- a sense amplifier connected between two of the small charge storing devices.

20. The apparatus as claimed in claim 19 further comprising one or more memory cells connected to the first data line and one or more memory cells connected to the second data line.

21. The apparatus of claim 19, wherein the charge storing devices are capacitors.

22. The apparatus of claim 19, wherein the first data line is a bit line and the second data line is a complementary bit line.

* * * * *